US009680066B2

(12) United States Patent
Emoto et al.

(10) Patent No.: US 9,680,066 B2
(45) Date of Patent: Jun. 13, 2017

(54) PHOSPHOR, LIGHT EMITTING ELEMENT, AND LIGHT EMITTING DEVICE

(71) Applicant: DENKA COMPANY LIMITED, Tokyo (JP)

(72) Inventors: Hideyuki Emoto, Tokyo (JP); Shinichi Yanagi, Tokyo (JP); Masayoshi Ichikawa, Fukuoka (JP); Kazuhiro Ito, Tokyo (JP)

(73) Assignee: DENKA COMPANY LIMITED, Tokyo, OT (JP)

( * ) Notice: Subject to any disclaimer, the term of this patent is extended or adjusted under 35 U.S.C. 154(b) by 0 days.

(21) Appl. No.: 15/121,317

(22) PCT Filed: Feb. 25, 2015

(86) PCT No.: PCT/JP2015/055382
§ 371 (c)(1),
(2) Date: Aug. 24, 2016

(87) PCT Pub. No.: WO2015/129741
PCT Pub. Date: Sep. 3, 2015

(65) Prior Publication Data
US 2017/0012181 A1    Jan. 12, 2017

(30) Foreign Application Priority Data

Feb. 26, 2014   (JP) .................................. 2014-036007
Feb. 26, 2014   (JP) .................................. 2014-036011

(51) Int. Cl.
*H01L 33/50*       (2010.01)
*C09K 11/61*       (2006.01)

(52) U.S. Cl.
CPC .......... *H01L 33/502* (2013.01); *C09K 11/617* (2013.01); *H01L 33/50* (2013.01); *H01L 33/501* (2013.01)

(58) Field of Classification Search
None
See application file for complete search history.

(56) References Cited

U.S. PATENT DOCUMENTS 3,576,756 A    4/1971  Russo
6,020,067 A    2/2000  Iwama et al.
(Continued)

FOREIGN PATENT DOCUMENTS

JP    58089680    5/1983
JP    04178486    6/1992
(Continued)

*Primary Examiner* — Minh-Loan Tran
(74) *Attorney, Agent, or Firm* — Rudy J. Ng; Carol L. Francis; Bozicevic, Field & Francis LLP

(57) ABSTRACT

The present invention relates to an $Mn^{4+}$-activated complex fluoride phosphor with improved moisture resistance due to modification of the particle surface, and a light emitting element and light emitting device having excellent color rendering properties and stability due to the use of this phosphor.

The phosphor of the present invention is characterized in that it is represented by the general formula: $A_2MF_6:Mn^{4+}$, wherein element A is an alkali metal element comprising at least K, element M is one or more metal elements chosen from among Si, Ge, Sn, Ti, Zr and Hf, F is fluorine, and Mn is manganese, wherein the phosphor comprises a Ca-containing compound on a particle surface.

8 Claims, 3 Drawing Sheets

(56) References Cited

U.S. PATENT DOCUMENTS

| | | | |
|---|---|---|---|
| 8,057,706 B1 | 11/2011 | Setlur | |
| 8,491,816 B2 * | 7/2013 | Hong | C09K 11/616 252/301.4 H |
| 2006/0169998 A1 | 8/2006 | Radkov et al. | |
| 2009/0110285 A1 | 4/2009 | Elad et al. | |
| 2010/0142189 A1 | 6/2010 | Hong et al. | |
| 2011/0043101 A1 | 2/2011 | Masuda et al. | |
| 2011/0058583 A1 | 3/2011 | Fukuda et al. | |
| 2012/0104317 A1 | 5/2012 | Nagatomi et al. | |
| 2012/0256125 A1 | 10/2012 | Kaneyoshi et al. | |
| 2013/0026908 A1 | 1/2013 | Nagatomi et al. | |
| 2013/0181164 A1 | 7/2013 | Sohn et al. | |
| 2014/0320788 A1 * | 10/2014 | Weiler | H01L 33/502 349/71 |
| 2015/0061488 A1 | 3/2015 | Yoshida | |

FOREIGN PATENT DOCUMENTS

| | | |
|---|---|---|
| JP | 2009096823 | 5/2009 |
| JP | 2013014715 | 1/2013 |
| JP | 2013177511 | 9/2013 |
| JP | 2013249375 | 12/2013 |
| WO | 2013105345 | 7/2013 |
| WO | 2013105346 | 7/2013 |

* cited by examiner

US 9,680,066 B2

PHOSPHOR, LIGHT EMITTING ELEMENT, AND LIGHT EMITTING DEVICE

TECHNICAL FIELD

The present invention relates to a phosphor that is excited by UV rays or blue light and emits red light, a light emitting element using this phosphor, and a light emitting device using this light emitting element. More specifically, the present invention relates to an $Mn^{4+}$-activated complex fluoride phosphor with improved moisture resistance due to modification of the particle surface, and a light emitting element and light emitting device having excellent color rendering properties and stability due to the use of this phosphor.

BACKGROUND ART

As white LEDs, those of the type in which pseudo-white light is obtained by combining a blue LED chip with a yellow phosphor are widely used. However, while white LEDs of this type fall within the white color range in terms of their chromaticity coordinate values, they have few emitted light components in the red color range and the like, so the appearance of an object illuminated by such a white LED differs considerably from the appearance of an object illuminated with natural light. In other words, such white LEDs have poor color rendering properties which are an indicator of the naturalness of appearance of objects.

Therefore, white LEDs with improved color rendering properties have been developed for practical use by combining red phosphors, orange phosphors or the like in addition to yellow phosphors, so as to compensate for the insufficient red components.

As such red phosphors, nitride phosphors and oxynitride phosphors activated with $Eu^{2+}$ are known. Representative of these phosphors are $Sr_2Si_5N_8:Eu^{2+}$, $CaAlSiN_3:Eu^{2+}$, $(Ca,Sr)AlSiN_3:Eu^{2+}$ and the like.

However, phosphors in which $Eu^{2+}$ is activated as the light emission central ion have a light emission spectrum with a broad half value width, so they have a tendency to include relatively many spectral components in wavelength regions outside the range visible to humans, and they have difficulty in achieving high luminance.

In recent years, phosphors using $Eu^{3+}$ and $Mn^{4+}$ as the light emission central ions have been developed as red phosphors having light emission spectra with narrow half value width and including many spectral components in regions of high visual sensitivity. Patent Documents 1 to 4 disclose phosphors in which $Mn^{4+}$ is activated in complex fluoride crystal $K_2SiF_6$, and light emitting devices using these phosphors. These phosphors are capable of achieving red light emissions with a narrow value width, and the light emitting devices using these phosphors are held to achieve excellent color rendering properties and color reproducibility.

RELATED ART DOCUMENTS

Patent Documents

Patent Document 1: JP 2009-528429 A
Patent Document 2: WO 2009/110285
Patent Document 3: US 3576756 A
Patent Document 4: JP 2012-224536 A

SUMMARY OF THE INVENTION

Problems to be Solved by the Invention

However, $Mn^{4+}$-activated phosphors that have complex fluoride crystals as their matrix have low stability, and in particular, hydrolysis of the phosphor tends to progress upon contact with water or water vapor. When hydrolysis occurs, not only are the fluorescence properties reduced, but also, the peripheral materials may be corroded by fluorine ions or hydrogen fluoride generated by the hydrolysis. For this reason, there were problems in development for practical use in terms of durability and reliability in LED light emitting devices comprising phosphors dispersed in sealing resins not capable of completely shutting out water vapor.

Means for Solving the Problems

As a result of performing diligent study in view of the above-described problems, the present inventors discovered that the moisture resistance can be improved without reducing the fluorescence properties, by treating $Mn^{4+}$-activated complex fluoride phosphors, which have excellent luminance, with a compound to serve as a Ca source and modifying the particle surfaces, thereby arriving at the present invention.

In other words, the phosphor of the present invention is basically a phosphor represented by the general formula: $A_2MF_6:Mn^{4+}$, wherein element A is an alkali metal element comprising at least K, element M is one or more metal elements chosen from among Si, Ge, Sn, Ti, Zr and Hf, F is fluorine, and Mn is manganese, wherein the phosphor comprises a Ca-containing compound on the particle surface.

In this phosphor, the atomic composition ratio Ca/(Ca+A) analyzed by X-ray photoelectron spectroscopy is preferably at least 0.05 and at most 1.

In this phosphor, the Ca-containing compound is preferably present in a range from the surface of the phosphor to a depth of 1.5 μm.

In this phosphor, the Mn amount (atomic %) on the outermost particle surface of the phosphor is preferably lower than the Mn amount in the particle interior. In particular, the ratio of the Mn amount on the outermost particle surface to the Mn amount in the particle interior ([Mn amount on outermost particle surface]/[Mn amount in particle interior]) is preferably 60% or less.

In this phosphor, element A is preferably K and element M is preferably Si and/or Ge.

Additionally, the light emitting element of the present invention basically comprises the aforementioned phosphor and an emission light source. Furthermore, the light emitting device of the present invention basically comprises the aforementioned light emitting element.

Effects of the Invention

The phosphor according to the present invention is a phosphor that has significantly superior moisture resistance, comprising a Ca-containing compound on the particle surface of an $Mn^{4+}$-activated complex fluoride phosphor, which is known as a high-luminance red-emitting phosphor.

For this reason, the light emitting element and light emitting device according to the present invention which use this phosphor have high color rendering properties and color reproducibility, and also have a long life span with little change over time.

MODES FOR CARRYING OUT THE INVENTION

Figure 1:
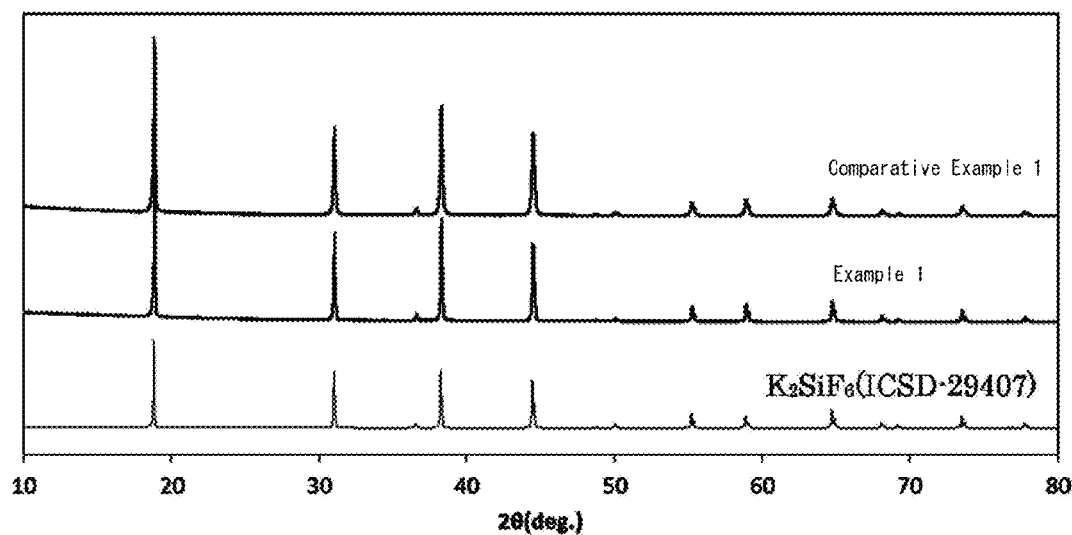
[FIG. 1] A diagram showing the X-ray diffraction patterns of $K_2SiF_6$, Example 1 and Comparative Example 1.

The present invention is a phosphor represented by the general formula: $A_2MF_6$:$Mn^{4+}$, wherein element A is an alkali metal element comprising at least K, element M is one or more metal elements chosen from among Si, Ge, Sn, Ti, Zr and Hf, F is fluorine, and Mn is manganese, wherein the phosphor comprises a Ca-containing compound on the particle surface.

Here, "particle surface" refers to the range over which the surface modification by the compound to serve as the Ca source reaches, and is preferably in a range from the surface (depth 0 μm) of the phosphor to a depth of 1.5 μm. If the range of modification is too deep, then the excitation light absorption efficiency of the phosphor and the fluorescent light extraction efficiency from the phosphor may be reduced.

Additionally, "comprising" a Ca-containing compound on the particle surface typically includes states wherein fine particles of Ca-containing compounds such as calcium fluoride are deposited on the phosphor particle surface.

In the above-given general formula: $A_2MF_6$:$Mn^{4+}$, $Mn^{4+}$ is the ion that is activated as the light emission center, and is in the form of a solid solution substituting a portion of the element M.

The element A is an alkali metal element comprising at least K, and preferably has a high K content. Specific examples of the element A include K alone, a combination of K and Na, a combination of K and Li, and a combination of K, Na and Li. In order to obtain a stronger light emission intensity, K alone is preferred.

The element M is a metal element of at least one type chosen from among Si, Ge, Sn, Ti, Zr and Hf The element M preferably comprises at least Si and/or Ge, and specific examples include Si alone, Ge alone, a combination of Si and Ge, a combination of Si and Sn, a combination of Si and Ti, a combination of Si, Ge and Sn, a combination of Si, Ge and Ti, a combination of Si, Sn and Ti, and a combination of Si, Ge, Sn and Ti. The element M affects the excitation band of the phosphor. Si and/or Ge are preferred for achieving efficient light emissions with blue light.

The method for producing the phosphor before modifying the particle surface is not particularly limited, and a well-known production method such as those described in Patent Documents 1 to 4 may be used. Specifically, it is possible to use:

a method of dissolving the compound to serve as the matrix crystal of the phosphor and a compound comprising $Mn^{4+}$ which is the light emission center in hydrofluoric acid, and evaporating the solvent to solidify and cause reprecipitation (Patent Document 1);

a method of immersing a single metal such as silicon in a mixed solution of hydrofluoric acid and potassium permanganate (Patent Document 2);

a method of adding a poor solvent such as acetone or methanol to an aqueous hydrofluoric acid solution in which the component elements of the complex fluoride phosphor are dissolved, so as to cause precipitation of the phosphor (Patent Document 3); and a method of dissolving the component elements of the complex fluoride phosphor in two or more types of hydrofluoric acid from which the solid does not precipitate, mixing the two and causing a reaction and crystallization (Patent Document 4).

The $Mn^{4+}$-activated complex fluoride phosphors before surface modification produced by these methods are soluble in water, react with water and undergo hydrolysis, and generate hydrogen fluoride, which is highly corrosive, and colored compounds that absorb visible light, such as manganese dioxide. Hydrogen fluoride accelerates the deterioration of constituent members constituting light emitting elements.

By treating these phosphors with compounds that serve as a Ca source and including Ca-containing compounds on the particle surface, the moisture resistance can be significantly improved.

The means for making the particle surface of the phosphor comprise a Ca-containing compound is not particularly limited as long as the Ca-containing compound generated from the Ca source is able to be physically or chemically deposited on the phosphor particle surface, and it may be wet or dry. As long as the Ca-containing compound has low water solubility, it may be either crystalline or amorphous, and a preferable example is calcium fluoride ($CaF_2$). Calcium fluoride not only has extremely low solubility with respect to water, but it also does not easily dissolve in hydrofluoric acid which is used during production of phosphors nor in organic solvents such as acetone, methanol and ethanol, and is therefore suitable for use as a Ca-containing compound.

Preferable examples for depositing the Ca-containing compound on the particle surface of the phosphor will be indicated below.

First, the phosphor particles are dispersed in an organic solvent alone or in a mixed solution with hydrofluoric acid, to prepare a suspension. The organic solvent is preferably acetone, methanol or ethanol. Next, to this suspension is added a solution in which is dissolved a compound to serve as a Ca source such as calcium chloride. The solvent may be water or an organic solvent. The Ca ions in the solution react with hydrogen fluoride present in the suspension and are precipitated onto the phosphor particle surfaces as $CaF_2$.

The hydrogen fluoride which is the reaction source of this reaction may be hydrogen fluoride that is generated by hydrolysis of the phosphor in the case where an aqueous solution is added, residual hydrogen fluoride that is present in the phosphor, or hydrofluoric acid that is added as a solvent. Since this reaction is performed with the phosphor in a state of dispersion in the solvent, it can be performed by adding the compound to serve as the Ca source during the washing step or the like after precipitation of the complex fluoride crystal in the process for producing the phosphor.

The Ca-containing compound does not necessarily need to be present over the entire particle surface of the phosphor, and the moisture resistance can be improved even if it is present on only a portion thereof.

If the Ca content on the particle surface of the phosphor is too low, the hydrolysis prevention effect cannot be achieved, and if there is too much, there is a tendency for the light emission properties of the phosphor to be detrimentally affected. For this reason, the atomic composition ratio Ca/(Ca+A) on the surface of the phosphor when measured by X-ray photoelectron spectroscopy (hereinafter referred to as "XPS") under the below-indicated conditions should be at least 0.05 and at most 1, more preferably at least 0.05 and at most 0.8, and even more preferably at least 0.05 and at most 0.6. An atomic composition ratio Ca/(Ca+A)=1 means that the entire particle surface is completely covered by the Ca compound.

X-ray source: monochromatic Al-Kα
Charge neutralization: electron gun 100 μA
Spectrum: pass energy
   200.00 eV=wide spectrum
   50.0 eV=narrow spectrum [O 1s, F 1s, Si 2p, K 2p, Ca 2p,
   Cl 2p, Mn 2p]
Measurement range: 400×200 μm
Extraction angle: 90° (from surface)

The elemental distribution in the depth direction in the vicinity of the particle surface of the phosphor can be measured by sputtering the phosphor sample with Ar ions during XPS. In the phosphor of the present invention, Ca should preferably be present in a range from the surface (0 μm) of the phosphor to a depth of 1.5 μm, more preferably to a depth of 1.0 μm. If Ca is present at a depth of 1.5 μm or more, the excitation light absorption efficiency of the phosphor and the fluorescent light extraction efficiency from the phosphor may be reduced.

Furthermore, in addition to comprising a Ca-containing compound on the particle surface of the phosphor, by making the Mn amount (atomic %) on the outermost particle surface of the phosphor lower than the Mn amount in the particle interior, the moisture resistance can be improved.

In this case, the "Mn amount on the outermost particle surface" of the phosphor refers to the Mn amount (atomic %) in the range from the surface of the phosphor to a depth of 300 nm. The elemental distribution of the phosphor varies largely with the depth in the vicinity of the particle surface, and the atomic composition ratio becomes constant upon reaching a certain depth or more. In the phosphor of the present invention, the Mn amount becomes roughly constant with respect to the depth direction at a depth of 300 nm or more from the surface of the phosphor. This Mn amount after becoming constant is referred to as the "Mn amount in the particle interior". The Mn amount in the particle interior can be measured by XPS while sputtering a phosphor sample with Ar ions.

The Mn amount present on the outermost particle surface is preferably as low as possible compared to the phosphor particle interior, and in particular, the ratio of the Mn amount on the outermost particle surface to the Mn amount in the particle interior ([Mn amount on outermost particle surface]/[Mn amount in particle interior]) should preferably be 60% or less, more preferably 50% or less, and even more preferably 30% or less.

The method for reducing the Mn amount on the outermost particle surface may be a method of reducing the relative Mn amount by depositing the Ca-containing compound and increasing the amount of the Ca-containing compound on the phosphor particle surface, a method of reducing the surface Mn amount of the phosphor particle itself, or further, a method combining these two. The method for depositing the Ca-containing compound on the particle surface of the phosphor is as described above. On the other hand, the method for reducing the surface Mn amount of the phosphor particle itself may be a method of suspending the phosphor in hydrofluoric acid, adding a hydrofluoric acid saturation solution of $A_2MF_6$ which is free of Mn, evaporating the solvent by heating, and depositing $A_2MF_6$ which is free of Mn on the phosphor particle surface.

The light emitting element of the present invention comprises the aforementioned phosphor of the present invention and an emission light source.

The emission light source may be a visible light LED or a UV LED that emits light of wavelengths of at least 250 nm and at most 550 nm, among which a blue LED light emitting element of at least 420 nm and at most 500 nm is preferred.

As the phosphor used in the light emitting element, other conventionally known phosphors may be used in combination with the phosphor of the present invention. By combining the phosphor of the present invention with a phosphor emitting a different color of light such as a green light-emitting phosphor, a yellow light-emitting phosphor or a red light-emitting phosphor, higher color rendering properties and higher luminance can be obtained.

The light emitting device according to the present invention uses the aforementioned light emitting element of the present invention, and examples include a backlight of a liquid crystal panel, an illumination device, a signal device used on roads or railways, or a projector.

EXAMPLES

Herebelow, the present invention will be described in further detail by means of the examples indicated below.

<Production of Raw Material $K_2MnF_6$>

First, the production method of $K_2MnF_6$ used as the Mn raw material of the phosphor in the following examples and comparative examples will be explained.

800 ml of hydrofluoric acid at a concentration of 40 mass % was poured into a Teflon (registered trademark) beaker with a capacity of 1 liter, and 260 g of $KHF_2$ powder (special grade chemical manufactured by Wako Pure Chemical Industries) and 12 g of potassium permanganate powder (grade 1 chemical manufactured by Wako Pure Chemical Industries) were dissolved.

While stirring the hydrofluoric acid reactant using a magnetic stirrer, 8 ml of 30% hydrogen peroxide water (special grade chemical manufactured by Wako Pure Chemical Industries) were dripped in a little at a time. When the dripped amount of hydrogen peroxide water exceeded a standard amount, yellow particles began to precipitate, and the color of the reactant began to change from purple. The stirring was continued for a while after dripping in the standard amount of hydrogen peroxide water, then the stirring was stopped and the precipitated particles were allowed to settle. The above-described reaction was entirely performed at ambient temperature.

After the precipitated particles settled, the operation of removing the supernatant, adding methanol, stirring and allowing to stand, then removing the supernatant and further adding methanol was repeated until the solution became neutral. Thereafter, the precipitated particles were recovered by filtration and dried, and the methanol was completely removed by evaporation to obtain 19 g of a $K_2MnF_6$ powder.

Examples 1 to 8 and Comparative Example 1

Examples 1 to 8 and Comparative Example 1 all relate to phosphors represented by the general formula: $A_2MF_6$:

$Mn^{4+}$, wherein element A is K, element M is Si, F is fluorine, and Mn is manganese, in other words phosphors represented by $K_2SiF_6:Mn^{4+}$. Comparative Example 1 is a conventional phosphor not comprising a Ca-containing compound on the particle surface, and Examples 1 to 8 are phosphors having a Ca-containing compound deposited on the particle surface.

Comparative Example 1

At ambient temperature, 500 ml of hydrofluoric acid at a concentration of 48 mass % was poured into a Teflon (registered trademark) beaker with a capacity of 1 liter, 50 g of $K_2SiF_6$ powder (manufactured by Wako Pure Chemical Industries, grade: for chemical use) and 5 g of $K_2MnF_6$ powder synthesized by the aforementioned method were added thereto to prepare a suspension.

The Teflon (registered trademark) beaker containing the suspension was placed on a hot plate and heated while stirring. After heating to about 80° C. and holding for a while, the inside of the beaker was inspected, and the powder was found to be completely dissolved and the solution had changed to a light brown color. This aqueous solution of hydrofluoric acid was further heated and the solvent was evaporated. With the evaporation of the solvent, pale yellow crystals were precipitated. Heating was stopped when the solvent amount was considerably reduced, and the solution was cooled to room temperature. Thereafter, the solution was washed with hydrofluoric acid having a concentration of 20 mass % and methanol, the solid part was separated and recovered by filtration, and the residual methanol was removed by evaporation using a drying treatment. A nylon sieve having 75 μm openings was used on the phosphor after the drying treatment to separate out only the matter passing through the sieve, resulting in the phosphor $K_2SiF_6:Mn^{4+}$ of Comparative Example 1.

Example 1

20 g of the phosphor of Comparative Example 1 were added to 100 ml of a mixed solution (volume ratio 1:1) of hydrofluoric acid having a concentration of 20% and methanol to prepare a suspension.

While stirring this suspension, 25 ml of an aqueous solution of calcium chloride having a concentration of 0.6 mol % were added. After addition, the suspension was further stirred for 10 minutes. After the stirring ended, the suspension was let stand to allow the phosphor to settle, and the operation of removing the supernatant, adding methanol thereto, stirring and allowing to stand, then removing the supernatant and further adding methanol was repeated until the solution became neutral.

Thereafter, the precipitated particles were recovered by filtration, and further dried to completely remove the methanol by evaporation, resulting in the phosphor of Example 1.

Examples 2 to 4

Examples 2, 3 and 4 were produced using entirely the same methods and conditions as Example 1, except that the concentration of the aqueous solution of calcium chloride added to the phosphor suspension was changed respectively to 0.3 mol %, 0.8 mol % and 1.2 mol %.

Examples 5 to 8

Examples 5 to 8 were produced using entirely the same methods and conditions as Example 1, except that the concentration of the aqueous solution of calcium chloride added to the phosphor suspension was changed respectively to 0.7 mol %, 0.2 mol %, 0.5 mol % and 1.4 mol %.

<Evaluation of Phosphor>

Next, the resulting phosphors were evaluated by the following method.

First, the phosphors of Comparative Example 1 and Examples 1 to 4 were evaluated as to their crystal phases, excitation spectrum/fluorescence spectrum, quantum efficiency, chromaticity coordinates, atomic composition ratio Ca/(K+Ca), surface structure and moisture resistance. The evaluation results are shown in Table 1 and FIGS. 1 to 4.

TABLE 1

| | | | | | | | Optical Properties (excitation 455 nm) | | |
|---|---|---|---|---|---|---|---|---|---|
| | CaCl Conc. | Chromaticity Coordinates | | Atomic Comp. Ratio (Ca/ (K + Ca)) | Ca Depth | Absorp. | Internal Quantum Effic. | External Quantum Effic. (%) Hi-Temp. Hi-Humid. Treatment | Moist. Resist. Eval. |
| | (mol %) | x | y | | (μm) | (%) | (%) | before after | |
| Comp. Ex. 1 | — | 0.691 | 0.307 | 0 | — | 74 | 85 | 63    50 | 79% |
| Ex. 1 | 0.6 | 0.691 | 0.307 | 0.21 | 0.6 | 75 | 85 | 64    62 | 97% |
| Ex. 2 | 0.3 | 0.692 | 0.306 | 0.07 | 0.4 | 74 | 84 | 62    59 | 95% |
| Ex. 3 | 0.8 | 0.692 | 0.306 | 0.36 | 0.9 | 73 | 84 | 61    60 | 98% |
| Ex. 4 | 1.2 | 0.691 | 0.307 | 0.52 | 1.6 | 67 | 84 | 56    55 | 98% |

<Crystal Phase>

The X-ray diffraction patterns of the phosphors were measured using an X-ray diffraction apparatus (Rigaku Ultima IV). The measurements were made using a Cu Kα tube.

The phosphors of Comparative Example 1 and Examples 1 to 4 all had the same pattern as a $K_2SiF_6$ crystal, and did not include any other crystal phases. The results of X-ray diffraction of a $K_2SiF_6$ crystal, the phosphor of Example 1 and the phosphor of Comparative Example 1 are shown in FIG. 1.

<Excitation Spectrum/Fluorescence Spectrum>

The excitation and fluorescence spectra of the phosphors were measured using a fluorescence spectrophotometer (Hitachi High Technologies F-7000). The excitation wavelength of the fluorescence spectrum during these measurements was 455 nm, and the monitored fluorescence wavelength of the excitation spectrum was 632 nm.

Figure 2:
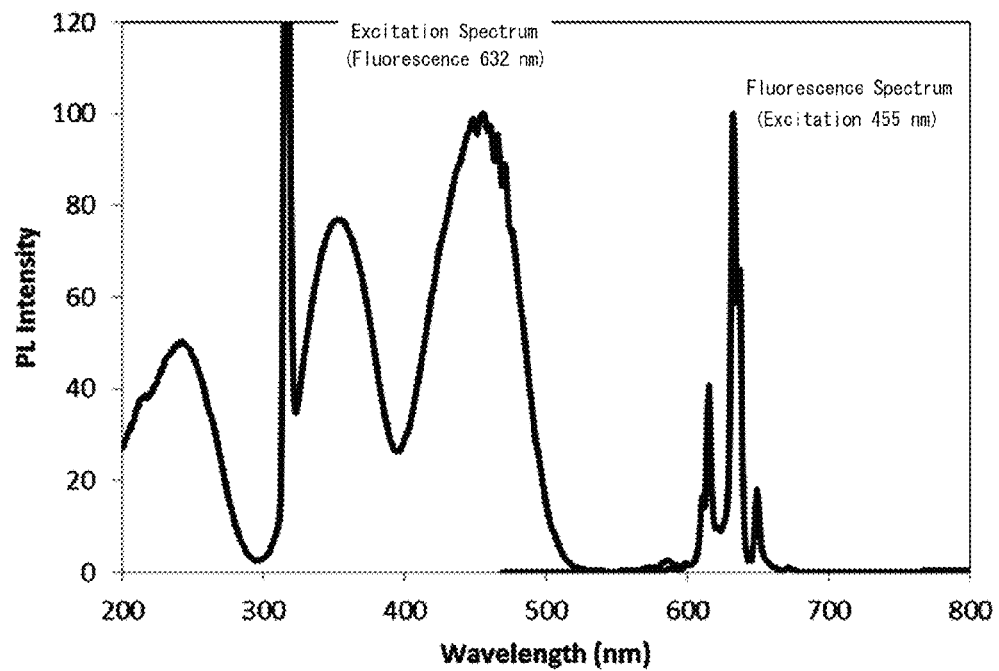
[FIG. 2] A diagram showing the excitation/fluorescence spectra of the phosphor of Comparative Example 1.

The measurement results for the phosphor of Comparative Example 1 are shown in FIG. 2. The phosphor of Comparative Example 1 had the excitation bands, of UV light with a peak wavelength in the vicinity of 350 nm and of blue light with a peak wavelength in the vicinity of 450 nm, and had a plurality of narrow-band light emissions in the red region of 600 to 700 nm.

The excitation and fluorescence spectra as measured by the fluorescence spectrophotometer for the phosphors of Examples 1 to 4 were almost the same shape as Comparative Example 1.

<Quantum Efficiency>

The quantum efficiencies of the phosphors were evaluated at ambient temperature by the following method.

A standard reflective plate (Labsphere Spectralon) having a reflectivity of 99% was set at a side-surface aperture ($\phi$ 10mm) of an integrating sphere ($\phi$ 60 mm). As an emission light source, monochromatic light divided into a wavelength of 455 nm from a Xe lamp was directed to this integrating sphere through an optical fiber, and the spectrum of the reflected light was measured using a spectrophotometer (Otsuka Electronics MCPD-7000). At that time, the number of excitation light photons (Qex) was calculated using the spectrum in the wavelength range of 450 to 465 nm.

Next, recessed cells filled with phosphors so that the surfaces were flat were set at the aperture of the integrating sphere and illuminated with monochromatic light of wavelength 455 nm, and the spectra of the reflected excitation light and the fluorescent light were measured by a spectrophotometer. The number of photons of the reflected excitation light (Qref) and the number of photons of fluorescent light (Qem) were calculated from the resulting spectral data.

The number of reflected excitation light photons was measured in the same wavelength range as the number of excitation light photons, and the number of fluorescent light photons was calculated in the range of 465 to 800 nm.

From the numbers of these three types of photons, the external quantum efficiency=Qem/Qex×100, the absorption rate=(Qex−Qref)/Qex×100 and the internal quantum efficiency=Qem/(Qex−Qref)×100 were determined.

<Chromaticity Coordinates>

The chromaticity coordinates (x, y) were calculated using a color function such as CIE1931 in accordance with the calculation method in the XYZ colorimetric system defined in JIS Z 8701, using a method compliant with JIS Z 8724 (Methods of Color Measurement—Light-source color—) for the spectra measured by setting the phosphors. The wavelength range used for chromaticity coordinate calculation was 465 to 780 nm.

<Atomic Composition Ratio Ca/(Ca+A)>

The atomic composition ratio Ca/(Ca+A) of the phosphor surface analyzed by X-ray photoelectron spectroscopy is an indicator of the amount of Ca present on the particle surface of a phosphor. The amount (atomic %) of Ca and K present was measured by XPS using a Thermo Fisher Scientific K-Alpha, under the following conditions.

X-ray source: monochromatic Al-K$\alpha$
Charge neutralization: electron gun 100 µA
Spectrum: pass energy
  200.00 eV=wide spectrum
  50.0 eV=narrow spectrum [O 1s, F 1s, Si 2p, K 2p, Ca 2p, Cl 2p, Mn 2p]
Measurement range: 400×200 µm
Extraction angle: 90° (from surface)

Ca was not present on the phosphor surface of Comparative Example 1 measured by the above-mentioned method. Specifically, there was less than 0.1 atomic %, the lower limit of detection, of Ca.

On the other hand, upon performing elemental analysis of the phosphor particle surface of Example 1, there was 23 atomic % of K and 6 atomic % of Ca. As a result, the atomic composition ratio Ca/(k+Ca) of the phosphor surface of Example 1 was Ca/(Ca+K)=6/(6 +23)=0.21. The atomic composition ratios Ca/(k+Ca) of Examples 2, 3 and 4 were respectively 0.07, 0.36 and 0.52.

Furthermore, elemental analyses of the particle interiors, i.e. in the depth direction, of the phosphors were performed by XPS while sputtering the phosphor samples with Ar ions.

The sputtering conditions were as follows.
Sputtered ions: Ar ions
Ion energy: 3 keV
Sputtering speed: 0.69 nm/min ($Ta_2O_5$ conversion)
Ion radiation range: 2×4 mm Elemental analysis was performed for every 60 seconds of sputtering under these conditions.

The depth at which Ca became less than the lower limit of detection was 0.6 µm in the phosphor of Example 1, and respectively 0.4 µm, 0.9 µm and 1.6 µm in Examples 2, 3 and 4.

<Observation of Fine Particle Structure on Phosphor Particle Surface>

The surfaces of the phosphors were observed with a scanning electron microscope (SEM/manufactured by JEOL, JSM-7001F SHL).

Figure 3:
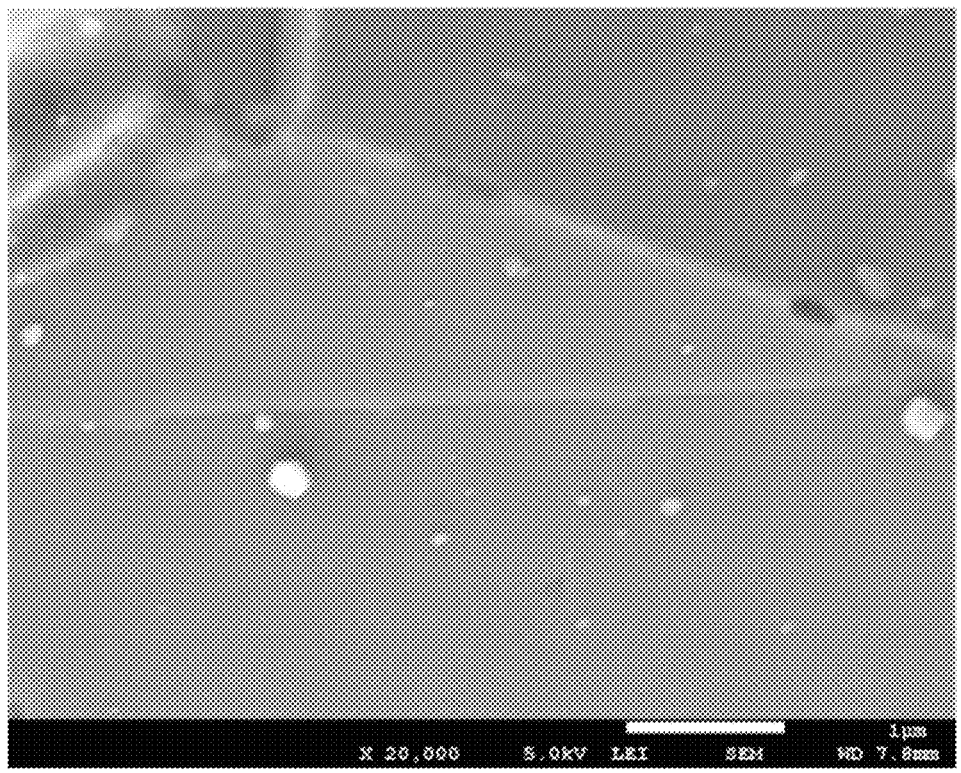
[FIG. 3] A scanning electron microscope photograph showing the phosphor particle surface of Comparative Example 1.
Figure 4:
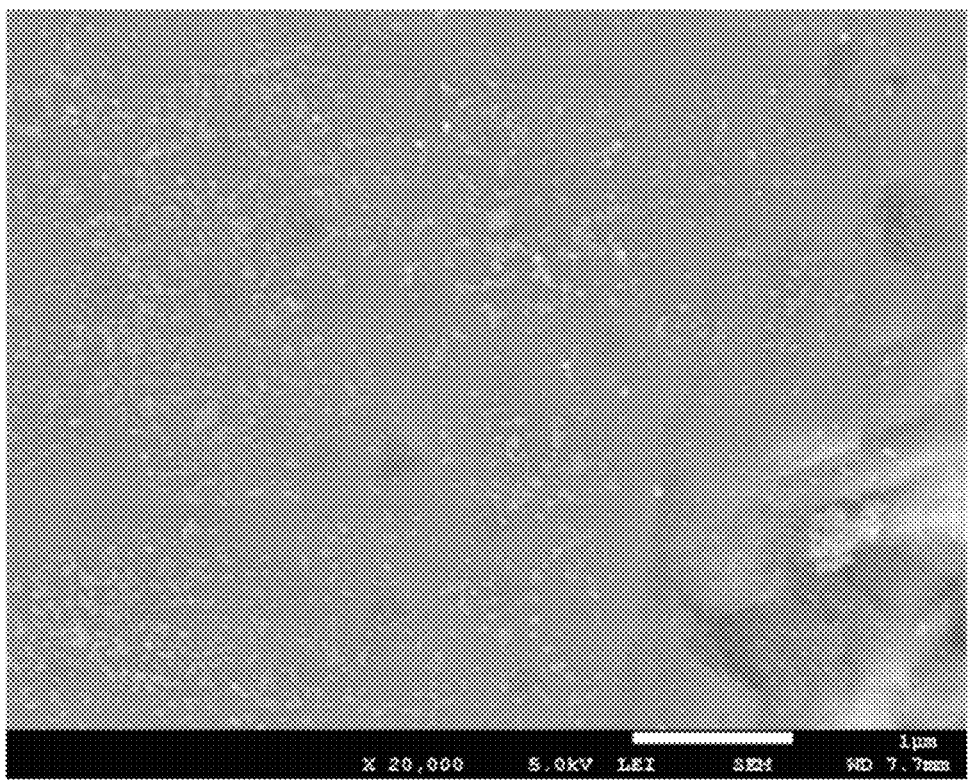
[FIG. 4] A scanning electron microscope photograph showing the phosphor particle surface of Example 1.

An SEM photograph of the surface of the phosphor of Comparative Example 1 is shown in FIG. 3, and an SEM photograph of the surface of the phosphor of Example 1 is shown in FIG. 4.

While the surface of the phosphor of Comparative Example 1 had some fine particles believed to be of different phases as well as pit-shaped defects and step-shaped defects formed during crystal growth, the surface was otherwise smooth.

On the other hand, many fine particles of a Ca-containing compound, which were not observed on the phosphor of Comparative Example 1, were deposited on the surface of the phosphor of Example 1. The deposited Ca-containing compound is $CaF_2$.

<Moisture Resistance Evaluation>

The moisture resistance of the phosphors were evaluated by the following method.

3 g of the phosphor were loaded in a $\phi$ 55 mm petri dish composed of PFA, which was set inside a thermo-hydrostat (Yamato Scientific IW222) and treated for 4 hours under high-temperature high-humidity conditions of temperature 60° C. and relative humidity 90% RH, after which the external quantum efficiency was measured by the above-mentioned method and compared with the external quantum efficiency before the high-temperature high-humidity treatment. In other words, [external quantum efficiency after high-temperature high-humidity treatment]/[external quantum efficiency before high-temperature high-humidity treatment]×100 was calculated and evaluated as an indicator of the moisture resistance.

In the case of Comparative Example 1, the absorption rate for excitation at 455 nm, the internal quantum efficiency, the external quantum efficiency and the chromaticity coordinates (x, y) after the high-temperature high-humidity treatment were respectively 76%, 66%, 50% and (0.690, 0.307). Due to the high-temperature high-humidity treatment, the internal quantum efficiency was largely reduced, and as a result, the external quantum efficiency was 79% of the efficiency before the high-temperature high-humidity treatment, lower than the 85% which was the passing grade for the moisture resistance evaluation.

On the other hand, in the case of Example 1, the external quantum efficiency of the phosphor after the high-temperature high-humidity treatment was 62%, and the moisture resistance evaluation was 97%. Additionally, the moisture resistance evaluations for the phosphors of Examples 2 to 4 were respectively 95%, 98% and 98%.

As shown in Table 1, by including a Ca-containing compound on the particle surface of the phosphor, a significant improvement in moisture resistance was observed. The Ca content in this case was confirmed to be sufficient if the atomic composition ratio Ca/(Ca+A) as analyzed by XPS is in the range of at least 0.05 and at most 1. Additionally, it was confirmed that if the range of presence of the Ca-containing compound is from the surface of the phosphor to a depth of 1.5 μm, the external quantum efficiency will not be significantly reduced and high luminance can be maintained.

Next, in addition to the above-mentioned evaluation categories, the phosphors of Comparative Example 1 and Examples 5 to 8 were evaluated as to the ratio of the Mn amount on the outermost particle surface to the Mn amount in the particle interior ([Mn amount on outermost particle surface]/[Mn amount of interior of particle]) by the following method. The evaluation results are shown in Table 2.

Figure 5:
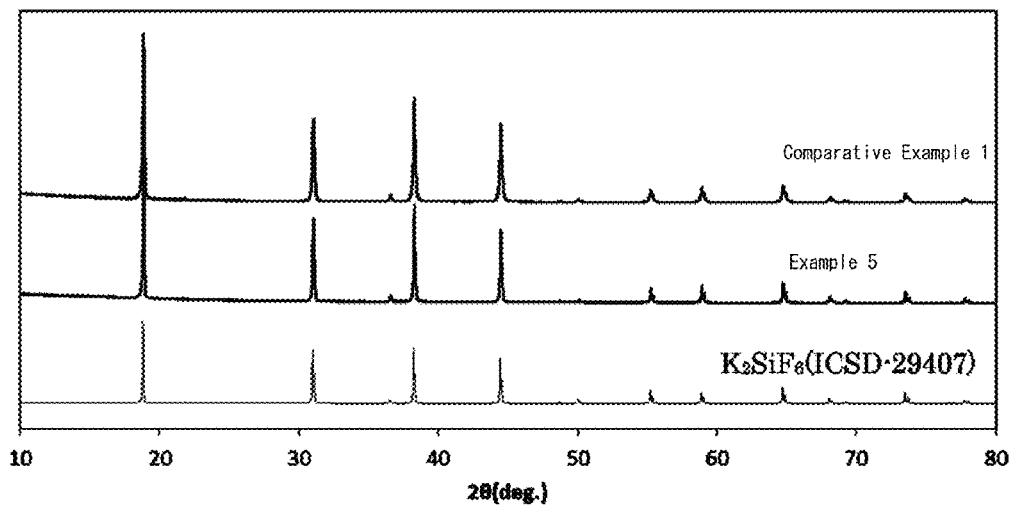
[FIG. 5] A diagram showing the X-ray diffraction patterns of $K_2SiF_6$, Example 5 and Comparative Example 1.

Additionally, the results of X-ray diffraction of a $K_2SiF_6$ crystal, the phosphor of Example 5 and the phosphor of Comparative Example 1 are shown in FIG. 5. The phosphors of Examples 5 to 8 all had the same pattern as the $K_2SiF_6$ crystal, and did not include other crystal phases.

The sputtering conditions were as follows.
Sputtered ions: Ar ions
Ion energy: 3 keV
Sputtering speed: 0.69 nm/min ($Ta_2O_5$ conversion)
Ion radiation range: 2×4 mm In the case of the phosphor of Comparative Example 1, the Mn amount on the outermost particle surface was 0.6 atomic % and the Mn amount in the particle interior measured at a depth of at least 300 nm was 0.8 atomic %. In other words, the ratio [Mn amount on outermost particle surface]/[Mn amount of the particle interior] was 75%.

On the other hand, in the case of Example 5, the Mn amount on the outermost particle surface was 0.2 atomic % and the Mn amount in the particle interior was 0.8 atomic %. In other words, the ratio [Mn amount on outermost particle surface]/[Mn amount of the particle interior] was 25%. Additionally, the ratios [Mn amount on outermost particle surface]/[Mn amount of the particle interior] of the phosphors of Examples 6, 7 and 8 were respectively 55%, 32% and 10%.

As shown in Table 2, an improvement in moisture resistance was observed when Ca-containing compounds were deposited on the particle surface of the phosphors, and also, the Mn amount on the outermost particle surface was lower than the Mn amount in the particle interior. In particular, a significant improvement in moisture resistance was observed when the ratio [Mn amount on outermost particle surface]/[Mn amount of the particle interior] was 60% or less.

Examples 9 and 10 and Comparative Example 2

Examples 9 and 10 and Comparative Example 2 all relate to phosphors represented by the general formula: $A_2MF_6$:

TABLE 2

| | | | [Mn amount on outermost particle surface]/ [Mn amount in particle interior] | Atomic Comp. Ratio Ca/ (K + Ca) | Optical Properties (excitation 455 nm) | | | | |
|---|---|---|---|---|---|---|---|---|---|
| | CaCl Conc. | Chromaticity Coordinates | | | Absorp. | Internal Quantum Effic. | External Quantum Effic. (%) Hi-Temp. Hi-Hum. Treatment | | Moist. Resist. |
| | (mol %) | x | y | | | (%) | (%) | before | after | Eval. |
| Comp. Ex. 1 | — | 0.691 | 0.307 | 75% | 0 | 74 | 85 | 63 | 50 | 79% |
| Ex. 5 | 0.7 | 0.691 | 0.307 | 25% | 0.30 | 75 | 84 | 63 | 62 | 98% |
| Ex. 6 | 0.2 | 0.692 | 0.306 | 55% | 0.06 | 75 | 84 | 63 | 57 | 90% |
| Ex. 7 | 0.5 | 0.692 | 0.306 | 32% | 0.19 | 74 | 84 | 62 | 60 | 97% |
| Ex. 8 | 1.4 | 0.691 | 0.307 | 10% | 0.63 | 68 | 84 | 57 | 57 | 100% |

<Ratio of Mn Amount on Outermost Particle Surface to Mn Amount in Particle Interior>

The Mn amount on the outermost particle surface of the phosphor was measured by XPS using a Thermo Fisher Scientific K-Alpha, under the following conditions.
X-ray source: monochromatic Al-Kα
Charge neutralization: electron gun 100 μA
Spectrum: pass energy
  200.00 eV=wide spectrum
  50.0 eV=narrow spectrum [O 1s, F 1s, Si 2p, K 2p, Ca 2p
  Cl 2p, Mn 2p]
Measurement range: 400×200 μm
Extraction angle: 90° (from surface)
On the other hand, the Mn amount in the particle interior was measured by XPS while sputtering the phosphor samples with Ar ions.

$Mn^{4+}$, wherein element A is K, element M is Ge, F is fluorine, and Mn is manganese, in other words phosphors represented by $K_2GeF_6$:$Mn^{4+}$. Comparative Example 2 is a conventional phosphor not comprising a Ca-containing compound on the particle surface, and Examples 9 and 10 are phosphors comprising a Ca-containing compound on the particle surface.

<Production of Raw Material $K_2GeF_6$>

The $K_2GeF_6$ to be used as the Ge raw material of the phosphors of Examples 9 and 10 and Comparative Example 2 were produced by the methods indicated below.

At ambient temperature, 800 ml of hydrofluoric acid at a concentration of 55 mass % was poured into a Teflon (registered trademark) beaker with a capacity of 1 liter, and 42 g of $GeO_2$ powder (manufactured by Kojundo Chemical Laboratory, purity at least 99.99%) were dissolved. Since the heat of dissolution of the $GeO_2$ powder raised the solution temperature to 40° C. or more, the solution was allowed to cool by radiation to 30° C. or lower. While stirring this aqueous solution of hydrofluoric acid using a magnetic stirrer, 95 g of a $KHF_2$ powder (special grade chemical manufactured by Wako Pure Chemical Industries) were added. The stirring was continued for about 10 minutes after addition, after which the stirring was stopped and the particles in the solution were allowed to settle.

After the particles settled, the operation of removing the supernatant, adding methanol, stirring and allowing to stand, then removing the supernatant and further adding methanol was repeated until the solution became neutral. Thereafter, the particles were recovered by filtration and further dried, and the methanol was completely removed to obtain 53 g of a white powder. This white powder was confirmed to be a single-phase $K_2GeF_6$ crystal as a result of measurement of the X-ray diffraction pattern.

Comparative Example 2

At ambient temperature, 500 ml of hydrofluoric acid at a concentration of 48 mass % was poured into a Teflon (registered trademark) beaker with a capacity of 1 liter, and 50 g of $K_2GeF_6$ powder synthesized by the aforementioned method and 4 g of $K_2MnF_6$ powder were added thereto to prepare a suspension.

This suspension was heated by the same method as Comparative Example 1 to evaporate the solvent, causing precipitation of a yellow crystal, which was washed with hydrofluoric acid having a concentration of 20 mass % and methanol, then filtered and dried to obtain the phosphor of Comparative Example 2 in the form of a yellow powder.
<Evaluation of Phosphor of Comparative Example 2>

The yellow powder of Comparative Example 2, as a result of X-ray diffraction, was found to have the same pattern as $K_2GeF_6$ crystal, and no other crystal phases were detected.

Figure 6:
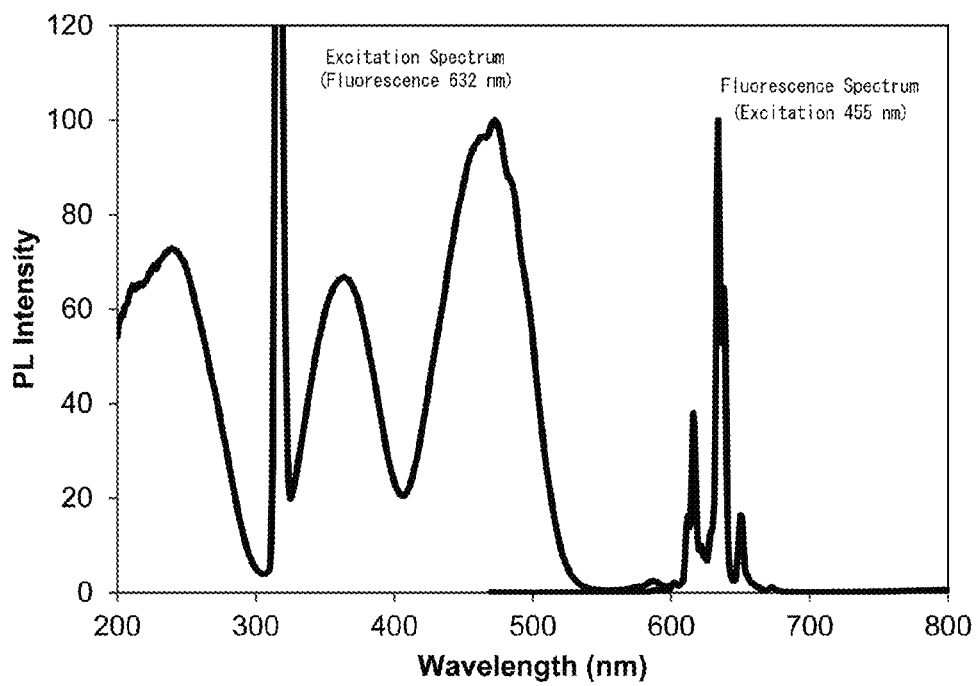
[FIG. 6] A diagram showing the excitation/fluorescence spectra of the phosphor of Comparative Example 2.

The excitation and fluorescence spectra of the phosphors measured using a fluorescence spectrophotometer are shown in FIG. 6. The excitation wavelength of the fluorescence spectrum during these measurements was 455 nm, and the monitored fluorescence wavelength of the excitation spectrum was 632 nm. The excitation spectrum of the phosphor of Comparative Example 2 was slightly shifted towards longer wavelengths compared to Comparative Example 1, but the fluorescence spectrum was almost the same as Comparative Example 1.

The rate of absorption when excited with blue light having a wavelength of 455 nm was 78%, the internal quantum efficiency was 88%, the external quantum efficiency was 68% and the chromaticity (x, y) was (0.693, 0.305).

In an analysis of the phosphor surface of Comparative Example 2 by XPS, no Ca was present on the phosphor surface. Additionally, the Mn amount on the outermost particle surface was 0.9 atomic % and the Mn amount in the particle interior was 1.0 atomic %, so the ratio of the Mn amount on the outermost particle surface to the Mn amount in the particle interior ([Mn amount on outermost particle surface]/[Mn amount in particle interior]) was 90%. The external quantum efficiency of the phosphor after high-temperature high-humidity treatment (60° C., 90% RH, 4 hours) was 54%, and the moisture resistance evaluation was 78%.

Example 9

20 g of the phosphor of Comparative Example 2 were added to 100 ml of a mixed solution (volume ratio 1:1) of hydrofluoric acid having a concentration of 20% and methanol to prepare a suspension.

While stirring this suspension, 25 ml of a methanol solution of calcium chloride having a concentration of 0.6 mol % were added. After addition, the suspension was further stirred for 10 minutes. After the stirring ended, the suspension was let stand to allow the phosphor to settle, and the operation of removing the supernatant and further adding methanol was repeated until the solution became neutral. Thereafter, the precipitated particles were recovered by filtration, and further dried to completely remove the methanol by evaporation, resulting in the phosphor of Example 9.
<Evaluation of Phosphor of Example 9>

The results of X-ray diffraction measurements and excitation/fluorescence spectrum measurements were almost the same as Comparative Example 2. The rate of absorption when excited with blue light having a wavelength of 455 nm was 77%, the internal quantum efficiency was 86%, the external quantum efficiency was 66% and the chromaticity (x, y) was (0.695, 0.305).

In an elemental analysis of Example 9 by XPS, there was 23 atomic % of K and 7 atomic % of Ca. As a result, the atomic composition ratio Ca/(k+Ca) of the phosphor surface was Ca/(Ca+K)=7/(7+23)=0.23. Additionally, as a result of analysis in the depth direction by Ar ion sputtering, the depth at which Ca became less than the lower limit of detection was 0.7 μm. The external quantum efficiency of the phosphor after the high-temperature high-humidity treatment was 66%, and the moisture resistance evaluation was 100%. Thus, it was confirmed that the moisture resistance is significantly improved by depositing a Ca-containing compound on the particle surface of a phosphor represented by $K_2GeF_6:Mn^{4+}$.

Example 10

20 g of the phosphor of Comparative Example 2 were added to 100 ml of a mixed solution (volume ratio 1:1) of hydrofluoric acid having a concentration of 20% and methanol to prepare a suspension.

While stirring this suspension, 25 ml of a methanol solution of calcium chloride having a concentration of 0.7 mol % were added. After addition, the suspension was further stirred for 10 minutes. After the stirring ended, the suspension was let stand to allow the phosphor to settle, and the operation of removing the supernatant and further adding methanol was repeated until the solution became neutral. Thereafter, the precipitated particles were recovered by filtration, and further dried to completely remove the methanol by evaporation, resulting in the phosphor of Example 10.
<Evaluation of Phosphor of Example 10>

The results of X-ray diffraction measurements and excitation/fluorescence spectrum measurements were almost the same as Comparative Example 2. The rate of absorption when excited with blue light having a wavelength of 455 nm was 76%, the internal quantum efficiency was 86%, the external quantum efficiency was 65% and the chromaticity (x, y) was (0.694, 0.305).

In an elemental analysis of Example 10 by XPS, there was 21 atomic % of K and 10 atomic % of Ca. As a result, atomic composition ratio Ca/(k+Ca) of the phosphor surface was Ca/(Ca+K)=10/(10+21)=0.32. Additionally, the Mn amount on the outermost particle surface was 0.2 atomic % and the Mn amount in the particle interior was 1.0 atomic %, so the ratio of the Mn amount on the outermost particle surface to the Mn amount in the particle interior ([Mn amount on outermost particle surface]/[Mn amount in particle interior]) was 20%. The external quantum efficiency of the phosphor after the high-temperature high-humidity treatment was 65%, and the moisture resistance evaluation was 100%. Therefore, it was confirmed that the moisture resistance is significantly improved when a Ca-containing compound is deposited on the particle surface of a phosphor represented by $K_2GeF_6:Mn^{4+}$, and also, the Mn amount on the outermost particle surface is lower than the Mn amount in the particle interior.

Example 11

A light emitting element comprising the phosphor of Example 1 and a blue light-emitting LED as the light emission light source was prepared. This light emitting element used the phosphor of Example 1 which has excellent moisture resistance, and therefore, in addition to having excellent color rendering properties and color reproducibility, the light emitting element had a milder decrease in luminance over time than a light emitting element using the phosphor of Comparative Example 1.

Example 12

An illumination device was prepared as a light emitting device using the light emitting element of Example 11. This light emitting device used the phosphor of Example 1 which has excellent moisture resistance, and therefore, in addition to having excellent color rendering properties and color reproducibility, the light emitting device had a milder decrease in luminance over time than a light emitting device using the phosphor of Comparative Example 1.

The invention claimed is:

1. A phosphor represented by the general formula: $A_2MF_6:Mn^{4+}$, wherein element A is an alkali metal element comprising at least K, element M is one or more metal elements chosen from among Si, Ge, Sn, Ti, Zr and Hf, F is fluorine, and Mn is manganese, wherein the phosphor comprises a Ca-containing compound on a particle surface.

2. The phosphor according to claim 1, wherein an atomic composition ratio Ca/(Ca+A) analyzed by X-ray photoelectron spectroscopy is at least 0.05 and at most 1.

3. The phosphor according to claim 1, wherein the Ca-containing compound is present in a range from the surface of the phosphor to a depth of 1.5 µm.

4. The phosphor according to any one of claim 1, wherein the Mn amount on the outermost particle surface of the phosphor is lower than the Mn amount in the particle interior.

5. The phosphor according to claim 4, wherein the Mn amount on the outermost particle surface of the phosphor is 60% or less of the Mn amount in the particle interior.

6. The phosphor according to any one of claim 1, wherein the element A is K, and the element M is Si and/or Ge.

7. A light emitting element comprising an emission light source and the phosphor according to any one of claim 1.

8. A light emitting device comprising the light emitting element according to claim 7.

* * * * *